(12) United States Patent
Pan

(10) Patent No.: US 10,802,325 B2
(45) Date of Patent: Oct. 13, 2020

(54) DISPLAY PANEL

(71) Applicant: Himax Display, Inc., Tainan (TW)

(72) Inventor: Po-Hung Pan, Tainan (TW)

(73) Assignee: Himax Display, Inc., Tainan (TW)

( * ) Notice: Subject to any disclaimer, the term of this patent is extended or adjusted under 35 U.S.C. 154(b) by 0 days.

(21) Appl. No.: 16/180,030

(22) Filed: Nov. 5, 2018

(65) Prior Publication Data

US 2020/0142248 A1 May 7, 2020

(51) Int. Cl.
*G02F 1/1335* (2006.01)
*H01L 21/02* (2006.01)
*G02F 1/1333* (2006.01)

(52) U.S. Cl.
CPC .. *G02F 1/133512* (2013.01); *H01L 21/02367* (2013.01); *G02F 2001/133302* (2013.01); *G02F 2001/133368* (2013.01)

(58) Field of Classification Search
CPC ........... G02F 1/33512; G02F 1/136277; G02F 2001/133368; G02F 2001/133354; G02F 2001/133302; H01L 21/02367
See application file for complete search history.

(56) References Cited

U.S. PATENT DOCUMENTS

2004/0201798 A1* 10/2004 Yeh ................... G02F 1/133516
349/106
2004/0252360 A1* 12/2004 Webber ............. G02F 1/133305
359/296
2016/0190502 A1 6/2016 Yang
2017/0017116 A1* 1/2017 Fukui ................ G02F 1/133528

FOREIGN PATENT DOCUMENTS

| CN | 206757243 | 12/2017 |
| JP | 2006267849 | 10/2006 |
| TW | M447510 | 2/2013 |

OTHER PUBLICATIONS

"Office Action of Taiwan Counterpart Application," dated Aug. 30, 2019, p. 1-p. 8.

* cited by examiner

*Primary Examiner* — Thanh Nhan P Nguyen
(74) *Attorney, Agent, or Firm* — JCIPRNET

(57) ABSTRACT

A display panel and a fabricating method are provided. A display panel may include a top substrate, a bottom substrate, and a display medium layer. The display medium layer may be disposed between the top substrate and the bottom substrate. The top substrate may include a support plate and a light shielding layer. The support plate may have a bottom surface facing the display medium layer and a top surface. The support plate includes a recess structure formed at the top surface and encircling an active region of the top substrate. The light shielding layer is disposed on the top surface of the support plate. The recess structure is at least partially located between the active region and the light shielding layer. A bottom surface of the light shielding layer may be further from the bottom surface of the support plate than a bottom surface of the recess structure.

20 Claims, 9 Drawing Sheets

DISPLAY PANEL

BACKGROUND OF THE DISCLOSURE

1. Field of the Disclosure

The present disclosure generally relates to an electronic device, in particular, to a display panel.

2. Description of Related Art

In a typical display panel, a display medium layer is sandwiched between a top substrate and a bottom substrate. The two substrates are kept together via a sealant to form a display cell. A light shielding layer is usually added to a display panel to delineate the display area. The light shielding layer can have a frame-like pattern, or a matrix-like pattern, and the region surrounded by the frame-like pattern or the matrix-like pattern serves as the display region. In addition to define the display area, the light shielding layer might also prevent unwanted light leakage. The linearity and sharpness of the edges of the light shielding layer may affect the optical performance of the display panel. Therefore, how to produce a light shielding layer with sharp edges and good linearity is an active field of research.

SUMMARY OF THE DISCLOSURE

Accordingly, the present disclosure is directed to a display panel including a top substrate having a light shielding layer and a recess structure at least partially located between the light shielding layer and an active region of the top substrate.

Accordingly, the present disclosure is directed to a manufacturing method of a display panel including a top substrate having a light shielding layer and a recess structure at least partially located between the light shielding layer and an active region of the top substrate.

According to an embodiment, a display panel may include a top substrate, a bottom substrate, and a display medium layer. The display medium layer may be disposed between the top substrate and the bottom substrate. The top substrate may include a support plate and a light shielding layer. The support plate may have a bottom surface facing the display medium layer and a top surface. The support plate may include a recess structure formed at the top surface and encircle an active region of the top substrate. The light shielding layer may be disposed on the top surface of the support plate. The recess structure may be at least partially located between the active region and the light shielding layer. A bottom surface of the light shielding layer may be further from the bottom surface of the support plate than a bottom surface of the recess structure.

According to an embodiment, the support plate may further include a protruding portion entrenched by the recess structure, and the light shielding layer may be disposed on the protruding portion.

According to an embodiment, the recess structure may include an inner recess between the protruding portion and the active region, and an outer recess, and the protruding portion may be located between the inner recess and the outer recess.

According to an embodiment, an inorganic filler may be disposed in one or both of the inner recess and the outer recess.

According to an embodiment, a thickness of the support plate at a region where the protruding portion is and a thickness of the support plate at the active region may be both greater than a thickness of the support plate at a region where the recess structure is.

According to an embodiment, the thickness of the support plate at the region where the protruding portion is and the thickness of the support plate at the active region are not identical.

According to an embodiment, the display panel may further include an inorganic support formed in the recess structure of the top substrate. The inorganic support may be interposed between the light-shielding layer and the support plate.

According to an embodiment, the recess structure may have an inner wall encircling the active region and an outer wall encircling the inorganic support. A first gap may exist between the inorganic support and the inner wall of the recess structure, and a second gap may exist between the inorganic support and the outer wall of the recess structure.

According to an embodiment, the display panel may further include an inorganic filler filling the recess at one or both of the first gap and the second gap.

According to an embodiment, the inorganic support may include a plurality of stacked support layers.

According to an embodiment, a display panel may further include an anti-reflective layer disposed on the top surface in the active region of the top substrate.

According to an embodiment, the anti-reflective layer may further cover the top surface at the bottom of the recess structure.

According to an embodiment, the anti-reflective layer may further stack with the light shielding layer.

According to an embodiment, a portion of the anti-reflective layer may be disposed between the light-shielding layer and the support plate.

According to an embodiment, a top surface or a bottom surface of the portion of the anti-reflective layer may be coplanar with the top surface of the support plate in the active region.

According to an embodiment, the light shielding layer may be disposed between a portion of the anti-reflective layer and the support plate.

According to an embodiment, a top surface or a bottom surface of the light-shielding layer may be coplanar with the top surface of the support plate in the active region.

According to an embodiment, a method of fabricating a display panel may include at least the following steps. A top substrate is provided. The top substrate is assembled with a bottom substrate and a display medium layer. The display medium layer is sandwiched between the top substrate and the bottom substrate. Providing a top substrate may include at least the following steps. A recess structure is formed in a top surface of a support plate. The recess structures may encircle an active region of the top substrate. A light shielding layer is printed over the top surface of the support plate at a level further from a bottom surface of the support plate than a bottom of the recess structure. The recess structure may be at least partially located between the active region and the light shielding layer.

According to an embodiment, the light-shielding layer may be printed by flexographic printing, or gravure printing.

According to an embodiment, forming the recess structure may include forming an inner recess surrounding the active region and an outer recess surrounding the inner recess by removing a portion of the support plate. A protruding portion of the support plate may remain between the inner recess and the outer recess, and the light-shielding layer may be printed on the protruding portion.

According to an embodiment, an inorganic support may be formed in a central region of the recess structure, and the light-shielding layer may be printed over the inorganic support.

According to an embodiment, the recess structure or a portion of the recess structure may be filled with an inorganic filler on a side of the light shielding layer.

In view of the above, a display panel in accordance with some embodiments of the disclosure has a top substrate including a recess structure and a light shielding layer. The recess structure may be formed on a top surface of a support plate, and be at least partially located between the light shielding layer and an active region of the top substrate. In the display panels of the present disclosure, as the light shielding layer is printed after forming the recess structure, a sharpness of the walls of the recess structure may increase the edge linearity of the light shielding layer, thus improving the optical performance of the display panels.

BRIEF DESCRIPTION OF THE DRAWINGS

The accompanying drawings are included to provide further understanding of the disclosure, and are incorporated in and constitute a part of this specification. The drawings illustrate embodiments of the disclosure and, together with the description, serve to explain the principles of the disclosure.

Figure 1A:
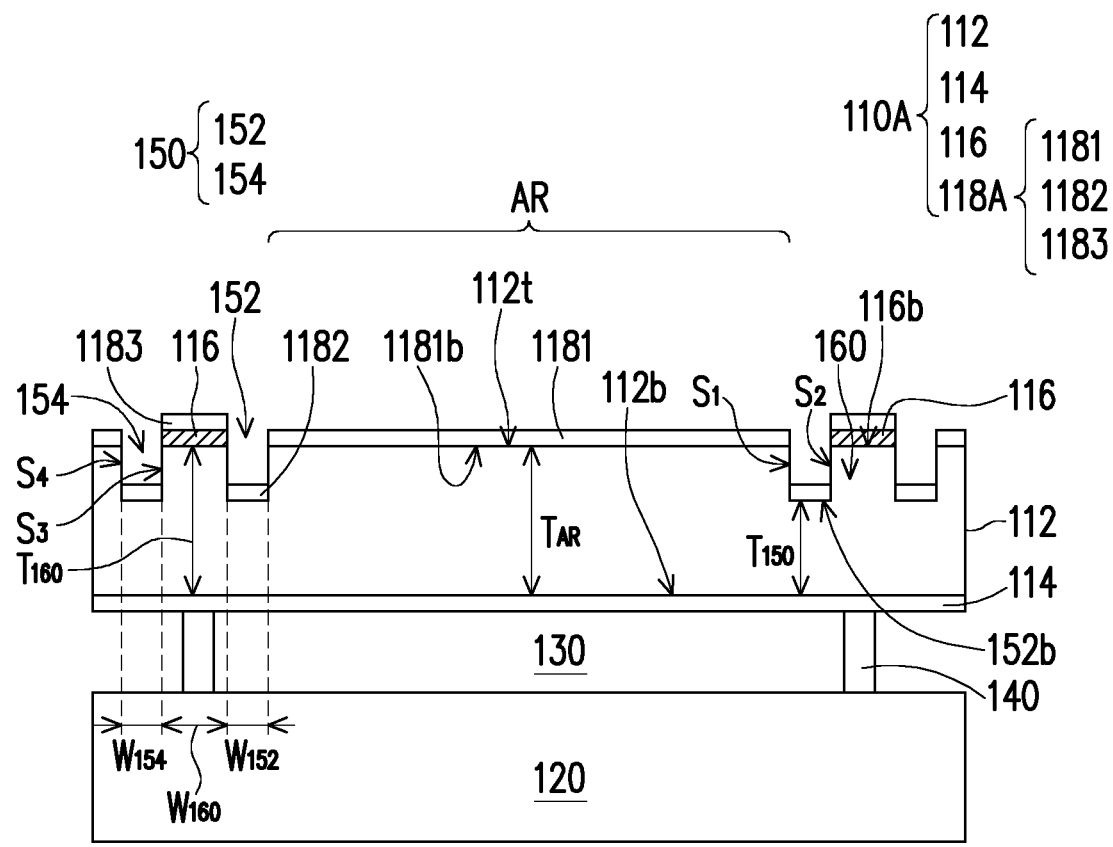
FIG. 1A shows a schematic cross-sectional view of a display panel according to an embodiment of the present disclosure.

In the drawings, the relative dimensions of the illustrated components might have been altered for the sake of clarity.

DESCRIPTION OF THE EMBODIMENTS

Reference will now be made in detail to the present preferred embodiments of the disclosure, examples of which are illustrated in the accompanying drawings. Wherever possible, the same reference numbers are used in the drawings and the descriptions to refer to the same or like parts.

In the present disclosure, the locution "an element A is disposed on an element B", used to describe a positional relationship, encompasses the possibilities of one or multiple other elements disposed between the element A and the element B, as well as the case of no other elements existing between the element A and the element B.

FIG. 1A shows a cross-sectional view of a display panel according to some embodiments of the present disclosure.

Referring to FIG. 1A, a display panel 100 includes a top substrate 110A, a bottom substrate 120 opposite to the top substrate 110A, a display medium layer 130, and a sealant 140. The top substrate 110A and the bottom substrate 120 are assembled via the sealant 140. The sizes of the top substrate 110A and the bottom substrate 120 may be similar, so that, upon stacking, an outline of the top substrate 110A and an outline of the bottom substrate 120 are aligned. However, in some alternative embodiments, the sizes of the top substrate 110A and the bottom substrate 120 may be different. The display medium layer 130 is sandwiched between the top substrate 110A and the bottom substrate 120 and is surrounded by the sealant 140. The display medium layer 130 may be made of liquid crystals, so that the top substrate 110A, the bottom substrate 120, the display medium layer 130, and the sealant 140 may serve as a liquid crystal cell, but the disclosure is not limited thereto.

In some embodiments, the top substrate 110A includes a support plate 112, an electrode layer 114, a light shielding layer 116, and an anti-reflective layer 118A. In some embodiments, the electrode layer 114 is disposed on a bottom surface 112b of the support plate 112 facing the display medium layer 130. In some embodiments, the electrode layer 114 blanketly covers the bottom surface 112b, but the disclosure is not limited thereto. The anti-reflective layer 118A and the light shielding layer 116 may be disposed on a top surface 112t of the support plate 112 opposite to the bottom surface 112b.

For sake of simplicity, in the drawings of the disclosure the bottom substrate 120 is shown as a plate-like structure, but, in some embodiments, the bottom substrate 120 may be a transistor array substrate comprising a support substrate (not shown), such as a glass plate or a silicon backplane, and a transistor array (not shown) disposed thereon. The transistor array may be a thin film transistor array, a CMOS (Complementary Metal-Oxide Semiconductor) device array, or the like. The transistor array and the electrode layer 114 may be used for providing the driving electric field to drive the display medium layer 130. In some embodiments, the display panel 100 may be a Thin Film Transistor Liquid Crystal Display (TFT-LCD) panel or an LCoS (Liquid Crystal on Silicon) display panel. In some embodiments, the electrode layer 114 may be omitted based on the driving circuit design of the display panel 100. It is to be intended that in display panels according to some embodiments of the disclosure, each of the elements listed above for the top substrate 110A and the bottom substrate 120 may be present, according to design and production requirements.

In some embodiments of the present disclosure, the support plate 112 of the top substrate 110A may be made of glass, or other transparent materials that allow a display light to pass through the top substrate 110A. In some embodiments, the display light presents an image on an active region AR of the top substrate 110A, so that the active region AR may be considered as a display area of the display panel 100. In some embodiments, the support plate 112 has a recess structure 150 formed at the top surface 112t. The recess structure 150 is excavated within the support plate 112, so that the top surface 112t has a non-flat profile presenting at least one recessed portion. In some embodiments, the recess structure 150 encircles the active region AR. In some embodiments, the recess structure 150 is at least partially located between the light shielding layer 116 and the active region AR. In some embodiments, the recess structure 150 includes an inner recess 152 surrounding the active region AR and an outer recess 154 surrounding the inner recess 152. In some embodiments, an inner wall $S_1$ of the inner recess 152 may define a boundary of the active region AR. In some embodiments, the inner recess 152 may overlap with a peripheral portion of the display medium layer 130. In some embodiments, the support plate 112 may have a protruding portion 160 located between the inner recess 152 and the outer recess 154. In some embodiments, the protruding portion 160 is delimited by an outer wall $S_2$ of the inner recess 152 and an inner wall $S_3$ of the outer recess 154. In other words, the protruding portion 160 may be entrenched in the recess structure 150. In some embodiments, a width $W_{152}$ of the inner recess 152 is measured as a distance between the inner wall $S_1$ and the outer wall $S_2$ of the inner recess 152, and is comprised in the range from 10 μm to 1 mm, but the disclosure is not limited thereto. In some embodiments, a width $W_{160}$ of the protruding portion 160 is measured as the distance between the outer wall $S_2$ of the inner recess 152 and the inner wall $S_3$ of the outer recess 154 and is in the range from 300 μm to 3 mm, but the disclosure is not limited thereto. In some embodiments, a width $W_{154}$ of the outer recess 154 is measured as a distance between the inner wall $S_3$ and an outer wall $S_4$ of the outer recess 154, and is comprised in the range from 10 μm to 1 mm, but the disclosure is not limited thereto. In some embodiments, the outer recess 154 may extend to the edge of the support plate 112 so that there may be no outer wall $S_4$ of the outer recess 154. In some embodiments, the walls $S_1$, $S_2$, $S_3$ and $S_4$, may have a sharp vertical profile, but the disclosure is not limited thereto.

Because of the presence of the recess structure 150, the support plate 112 may present a first thickness $T_{AR}$ in the active region AR of the top substrate 110A, a second thickness $T_{160}$ corresponding to the region where the protruding portion 160 is, and a third thickness $T_{150}$ where the recess structure 150 is located, and the first thickness $T_{AR}$ and the second thickness $T_{160}$ may be both greater than the third thickness $T_{150}$. In some embodiments, a thickness of the support plate 112 where the inner recess 152 is located is equal to a thickness of the support plate 112 where the outer recess 154 is located, so that the third thickness $T_{150}$ may be measured in correspondence of any one of the inner recess 152 and the outer recess 154. In some alternative embodiments, the thickness of the support plate 112 in correspondence of the inner recess 152 may be different from the thickness of the support plate 112 in correspondence of the outer recess 154, and the third thickness $T_{150}$ may be the smallest of the two thicknesses in correspondence of the inner recess 152 and the outer recess 154. In some embodiments, a ratio between the third thickness $T_{150}$ of the support plate 112 where the recess structure 150 is located and the first thickness $T_{AR}$ of the support plate 112 in the active region AR may be not greater than 0.5.

In some embodiments, the light shielding layer 116 is disposed over the top surface 112t of the top substrate 112 between the inner recess 152 and the outer recess 154. In some embodiments, the light shielding layer 116 is disposed in such a way that the inner recess 152 is interposed between the light shielding layer 116 and the active region AR. In some embodiments, a bottom surface 116b of the light shielding layer 116 is further from the bottom surface 112b of the support plate 112 than a bottom of the recess structure 150 such as the bottom surface 152b of the inner recess 152. In some embodiments, the bottom of the recess structure 150 may be defined as the portion of top surface 112t opposite to the bottom surface 112b exposed by the recess structure 150. The light shielding layer 116 is disposed over the protruding portion 160 of the support plate 112.

The light shielding layer 116 has a light shielding effect. The display light of the display panel 100 may be obstructed or shielded by the light shielding layer 116. A material of the light shielding layer 116 may include an organic ink, but the disclosure is not limited thereto. In some embodiments, the light shielding layer 116 is printed on the top substrate 110A after forming the recess structure 150. As discussed further below, the presence of the recess structure 150 during the printing step of the light shielding layer 116 may result in the light shielding layer 116 having sharp edges with good linearity.

The anti-reflective layer 118A may include a first portion 1181 extending on the top surface 112t of the support plate 112 in the active region AR of the top substrate 110A, a second portion 1182 extending at the bottom of the recess structure 150 and a third portion 1183 extending over the protruding portion 160 of the support plate 112. The light shielding layer 116 may be disposed directly on the protruding portion 160 of the support plate 112, with the third portion 1183 of the anti-reflective layer 118A stacked on top. That is, the light shielding layer 116 may be disposed between the third portion 1183 of the anti-reflective layer 118A and the protruding portion 160 of the support plate 112, but the disclosure is not limited thereto.

FIG. 1B to FIG. 1G show schematic cross-sectional views of top substrates of display panels according to some embodiments of the present disclosure, wherein the top substrates illustrated in FIG. 1B to FIG. 1G may be alternative embodiments for the top substrate 110A shown in FIG. 1A and the same or similar reference numbers denoted in the drawings represent the same or similar components. It should be noted that in the drawings of the present disclosure only the top substrate of a display panel according to some embodiments of the present disclosure may be shown for sake of simplicity. It is to be intended that all the top substrates illustrated in the present disclosure may be assembled with a bottom substrate and a display medium layer to form a display panel according to some embodiments.

Figure 1B:
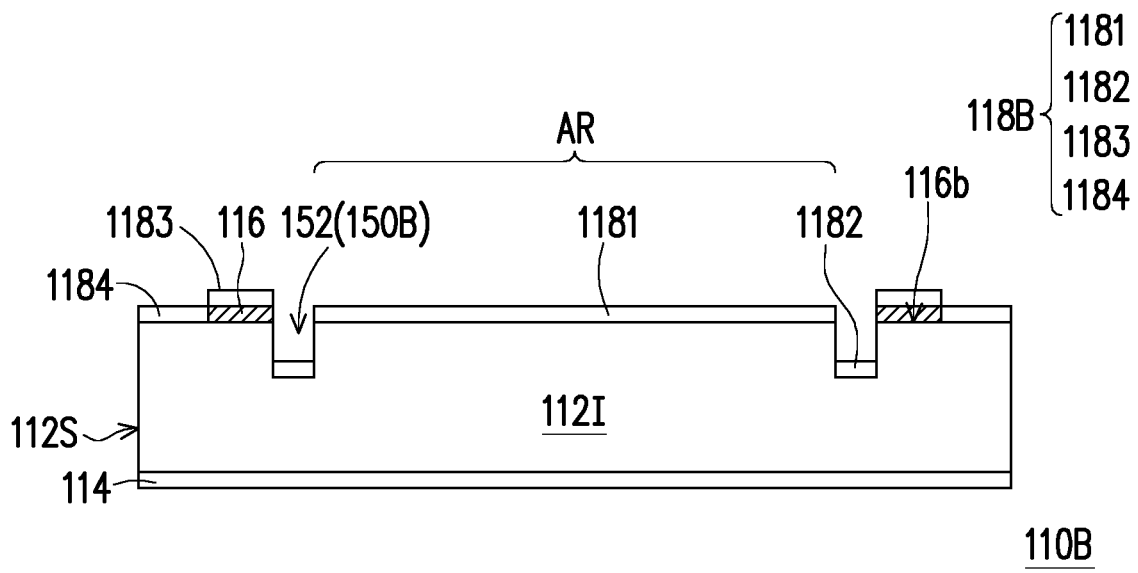
FIG. 1B to FIG. 1G show schematic cross-sectional views of top substrates of display panels according to some embodiments of the present disclosure.

In some alternative embodiments, as shown for the top substrate 110B of FIG. 1B, the top substrate 110B may include the support plate 112I, the electrode layer 114, the light shielding layer 116 and the anti-reflective layer 118B. The top substrate 110B is different from the top substrate 110A in that the outer recess 154 (shown in FIG. 1A) may be omitted in the support plate 112I of the top substrate 110B, and specifically, the support plate 112I has the recess structure 150B including only the inner recess 152. The recess structure 150B having only the inner recess 152 is completely located between the active region AR of the top substrate 110B and the light shielding layer 116. In addition, the anti-reflective layer 118B may comprise the first portion 1181 extending in the active region AR of the top substrate 110B, the second portion 1182 extending at the bottom of the recess structure 150B, the third portion 1183 stacking with the light shielding layer 116, and an outer portion 1184 extending from an outer edge of the light shielding layer 116 to an outer edge 112S of the support plate 112I at a level coplanar to the bottom surface 116b of the light shielding layer 116.

Figure 1C:
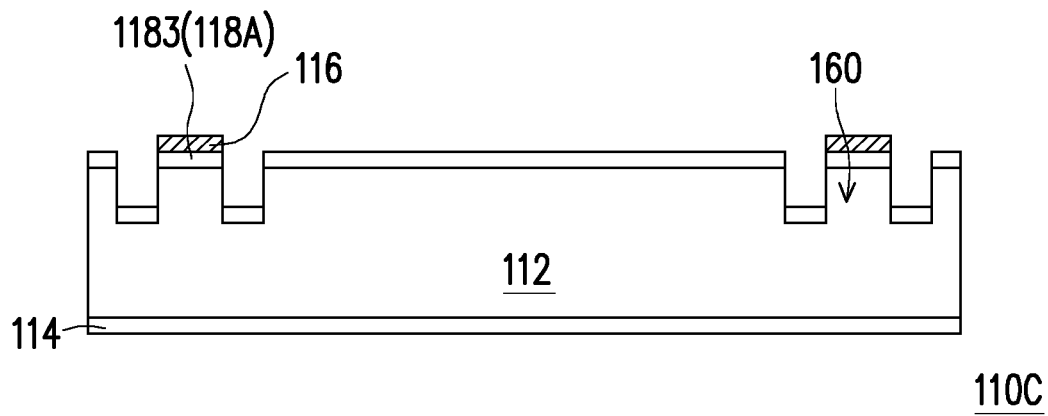

As seen in the alternative top substrate 110C illustrated in FIG. 1C, in some embodiments of the present disclosure, the top substrate 110C may, similar to the top substrate 110A, include the support plate 112, the electrode layer 114, the light shielding layer 116 and the anti-reflective layer 118A, while, different from the top substrate 110A, the light shielding layer 116 of the top substrate 110C may be disposed on the third portion 1183 of the anti-reflective layer 118A over the protruding portion 160. That is, the third portion 1183 of the anti-reflective layer 118A may be disposed between the light shielding layer 116 and the protruding portion 160 of the support plate 112.

Figure 1D:
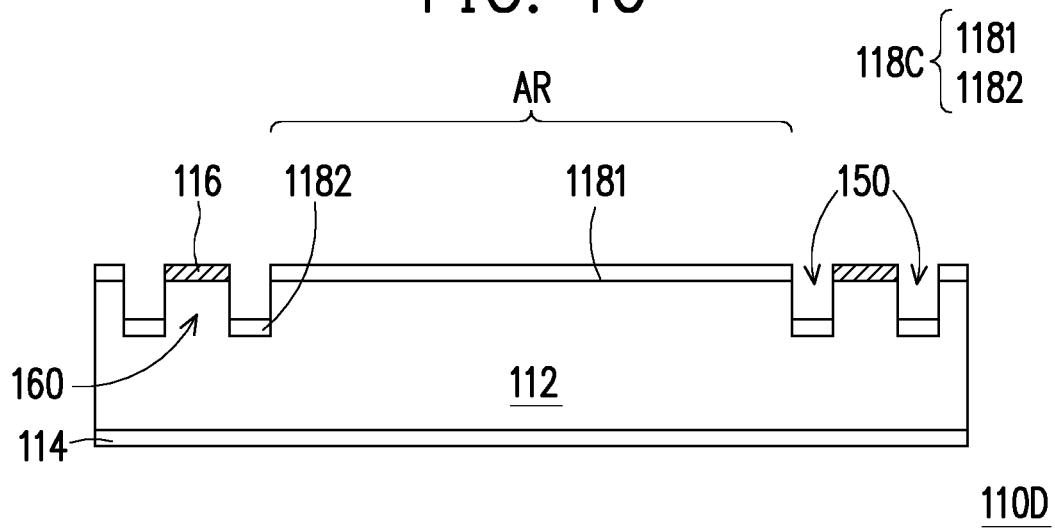
Figure 1E:
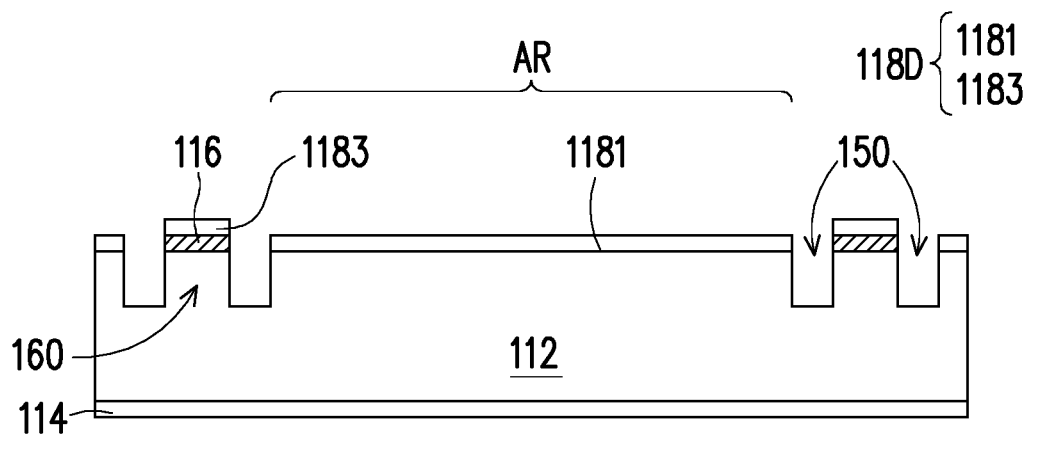

In FIG. 1D is shown a top substrate 110D according to some alternative embodiments. The top substrate 110D may, similar to the top substrate 110A, include the support plate 112, the electrode layer 114, the light shielding layer 116 and the anti-reflective layer 118C, while different from the top substrate 110A, the anti-reflective layer 118C of the top substrate 110D may be absent from the regions where the light shielding layer 116 is disposed. That is, the light shielding layer 116 may be disposed on the support plate 112 without having the anti-reflective layer 118C stacked neither above nor below. As shown in FIG. 1D, according to some embodiments the anti-reflective layer 118C may still include the first portion 1181 extending in the active region AR of the top substrate 110D and the second portion 1182 extending at the bottom of the recess structure 150, while not including the portion (as the third portion 1183 shown in FIG. 1A) extending over the protruding portion 160. In some alternative embodiments, as shown in FIG. 1E, a top substrate 110E may be similar to the top substrate 110A and include the support plate 112, the electrode layer 114, the light shielding layer 116 and the anti-reflective layer 118D The anti-reflective layer 118D of the top substrate 110E may include the first portion 1181 extending in the active region AR and the third portion 1183 extending on the protruding portion 160 without including the portion (as the second portion 1182 shown in FIG. 1A) at the bottom of the recess structure 150. In some alternative embodiments, the anti-reflective layer may be entirely omitted.

Figure 1F:
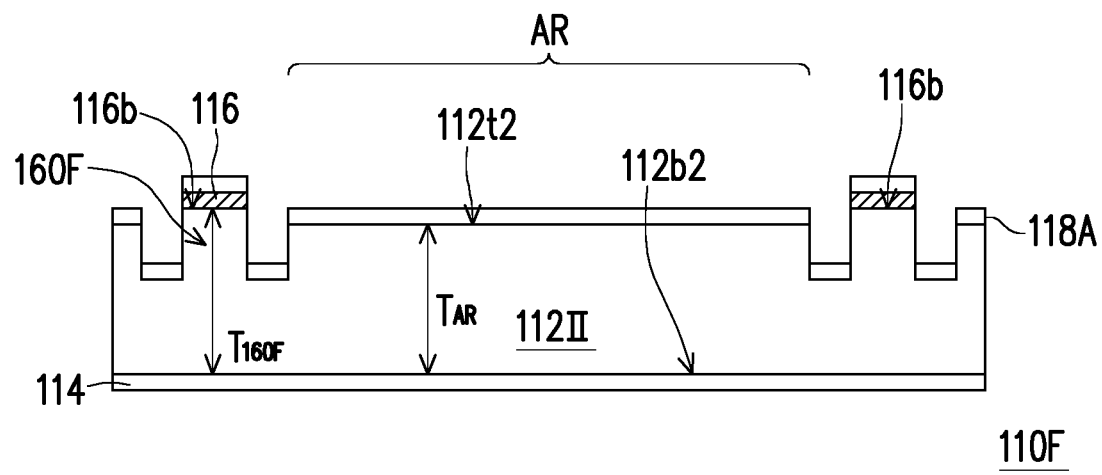
Figure 1G:
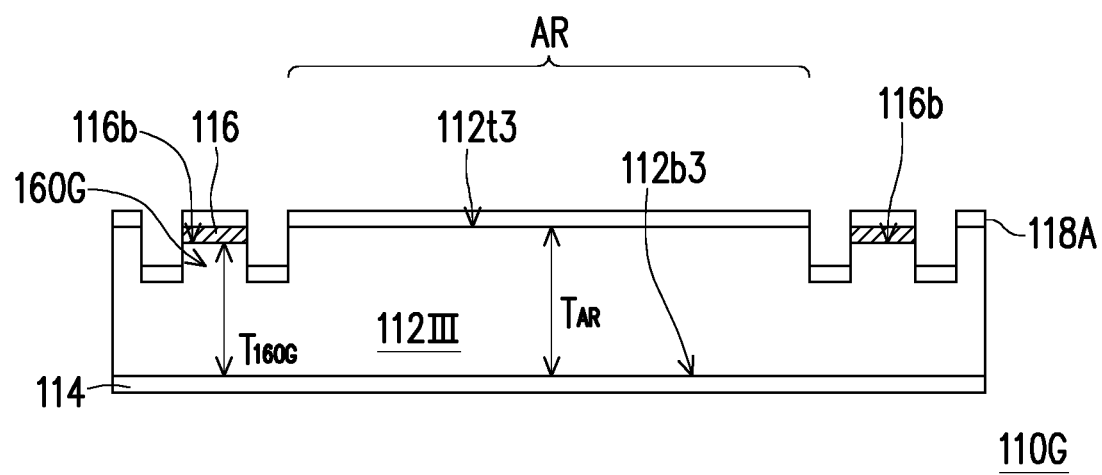

As illustrated in FIG. 1F and FIG. 1G, in some embodiments the thickness of the support plate at the place where the protruding portion is and the thickness of the support plate at the active region may not be identical. For example, in the top substrate 110F of FIG. 1F, the top substrate 110F includes the support plate 112II, the electrode layer 114, the light shielding layer 116 and the anti-reflective layer 118A, wherein the structure design and the disposition relationship of the electrode layer 114, the light shielding layer 116 and the anti-reflective layer 118A in the present embodiment may be similar to those in the embodiment depicted in FIG. 1A. However, the structure of the support plate 112II in FIG. 1F is different from the support plate 112 in FIG. 1A in that the thickness $T_{160F}$ of the support plate 112II where the protruding portion 160F is located is greater than the thickness $T_{AR}$ of the support plate 112II in the active region AR. Consequently, a bottom surface 116b of the light shielding layer 116 disposed on the protruding portion 160F is further from the bottom surface 112b2 of the support plate 112II than the top surface 112t2 of the support plate 112II in the active region AR. In some embodiments, a ratio between the thickness $T_{160F}$ and the thickness $T_{AR}$ may be in the range from 1.05 to 1.5, but the disclosure is not limited thereto.

In the top substrate 110G of FIG. 1G, the top substrate 110G includes the support plate 112III, the electrode layer 114, the light shielding layer 116 and the anti-reflective layer 118A, wherein the structure design and the disposition relationship of the electrode layer 114, the light shielding layer 116 and the anti-reflective layer 118A in the present embodiment may be similar to those in the embodiment depicted in FIG. 1A. However, the structure of the support plate 112III in FIG. 1G is different from the support plate 112 in FIG. 1A in that the thickness $T_{160G}$ of the support plate 112III where the protruding portion 160G is located is slightly smaller than the thickness $T_{AR}$ of the support plate 112III in the active region AR. Consequently, a bottom surface 116b of the light shielding layer 116 disposed on the protruding portion 160G is closer to the bottom surface 112b3 of the support plate 112III than the top surface 112t3 of the support plate 112III in the active region AR. In some embodiments, a ratio between the thickness $T_{160G}$ and the thickness $T_{AR}$ may be in the range from 0.95 to 0.5, but the disclosure is not limited thereto.

It should be noted that whilst in the remaining of the disclosure any structure of the support plates 112, 112I, 112II and 112III may be applicable as the support structure of the top substrate, though the drawings may only show the top substrates with the thickness $T_{160}$ of the support plate 112 where the protruding portion 160 is equal to the thickness $T_{AR}$ of the support plate 112 in the active region AR, as that shown in FIG. 1A, the disclosure is not limited thereto.

Figure 2A:
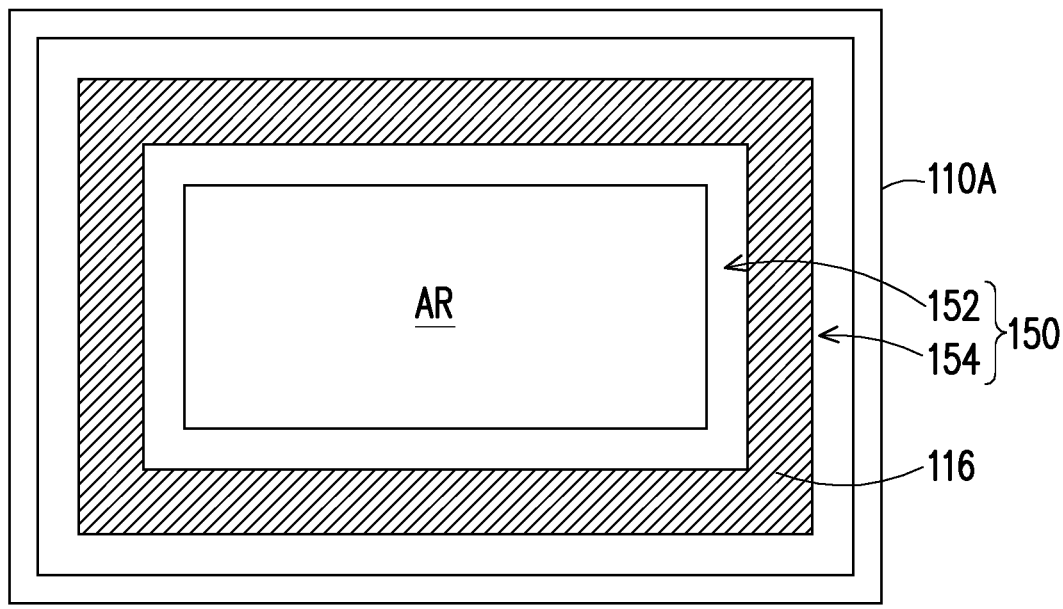
FIG. 2A to FIG. 2B show schematic top views of display panels according to some embodiments of the present disclosure.
Figure 2B:
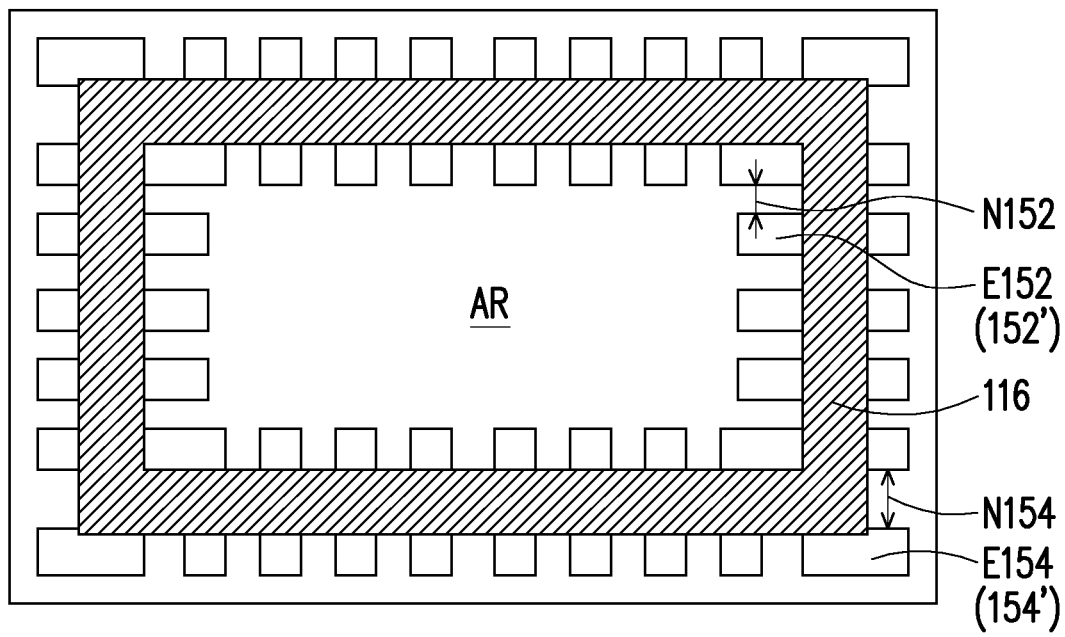

FIG. 2A to FIG. 2B show schematic top views of display panels according to some embodiments of the present disclosure. As shown in FIG. 2A, a display panel DP1 may include the top substrate 110A when viewed from the top. Specifically, the display panel DP1 may include most or all of the components depicted in FIG. 1A, but FIG. 2A only shows the light shielding layer 116 and the recess structure 150 and omits other components for illustrative purpose. In the present embodiment, the recess structure 150 may include the inner recess 152 and the outer recess 154 sandwiching the light shielding layer 116 in between. Each one of the inner recess 152, the light shielding layer 116, and the outer recess 154 may respectively have a frame-like pattern. In some embodiments, the inner recess 152, the light shielding layer 116 and the outer recess 154 may be disposed in a concentric manner surrounding the active region AR. Whilst in FIG. 2A the inner recess 152 and the outer recess 154 are shown to have a continuous frame pattern, in some alternative embodiments, a pattern of one or both of the inner recess 152 and the outer recess 154 may be discontinuous, as shown in the display panel DP2 of FIG. 2B. For example, as shown in FIG. 2B, the inner recess 152' may comprise a plurality of excavated portions E152 spaced from each other by a distance N152 and the outer recess 154' may comprise a plurality of excavated portions E154 spaced from each other by a distance N154. The excavated portions E152 are arranged along the inner edge of the light shielding layer 116 and the excavated portions E154 are arrange along the outer edge of the light shielding layer 116.

Figure 3A:
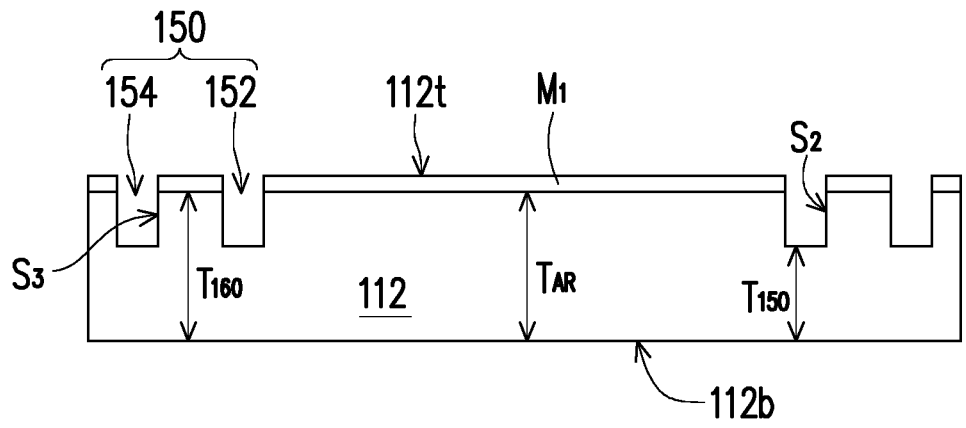
FIG. 3A to FIG. 3F are schematic views showing a top substrate undergoing a portion of the steps of a fabricating process of a display panel in accordance with some embodiments of the present disclosure.

FIG. 3A to FIG. 3F are schematic views showing a top substrate undergoing a portion of the steps of a fabricating process of a display panel in accordance with some embodiments of the present disclosure. The fabricating process may include the following steps, but is not limited thereto, and the order of the steps is also not limited to the order presented here. As illustrated in FIG. 3A, the recess structure 150 including the inner recess 152 and the outer recess 154 may be formed in the support plate 112, for example by employing a patterned auxiliary mask $M_1$ during an etching step. In some embodiments, a pre-fabricated rigid mask or a photoresist layer may be used for the patterned auxiliary mask $M_1$, but the disclosure is not limited thereto. In some embodiments, dry etching process (for example, plasma etching) or wet etching process (for example, using hydrofluoric acid as the etchant) may be adopted for the etching step, also depending on the material chosen for the support plate 112, but the disclosure is not limited thereto. In some embodiments, the formation of the recess structure 150 also produces the protruding portion 160 (not shown in FIG. 3A). Specifically, the protruding portion 160 is considered as a portion thicker than the adjacent portions where the recess structure 150 is formed. In some embodiments, the etching step is performed so that at least the outer wall $S_2$ of the inner recess 152 and the inner wall $S_3$ of the outer recess 154, which are the two walls that define the protruding portion 160, have a sharp vertical profile. After forming the recess structure 150, the patterned auxiliary mask $M_1$ may be removed. During the etching step, the thickness $T_{150}$ of the support plate 112 is determined (provided no back-grinding is performed on the bottom surface 112b) and is not greater than a half of the thickness $T_{AR}$. If so desired, the thickness $T_{160}$ of the support plate 112 where the protruding portion 160 is and the thickness $T_{AR}$ of the support plate 112 in the active region AR may be further adjusted, for example via a further etching step or a grinding step, such that the top substrates as shown in FIG. 1F or 1G may be made.

Figure 3B:
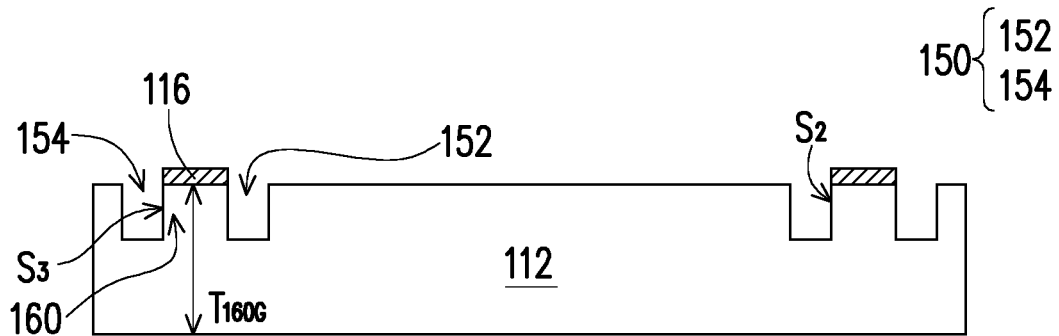

After removing the patterned auxiliary mask $M_1$, as shown in FIG. 3B, the light shielding layer 116 may be produced on the protruding portion 160, for example by photolithography or printing. In some embodiments, the light shielding layer 116 may be produced by ink-jet printing or super ink-jet printing, but the disclosure is not limited thereto. In some embodiments, as shown in FIG. 3C through FIG. 3F, the light shielding layer 116 may be produced by flexographic printing, microcontact printing or gravure printing using various tools.

Figure 3C:
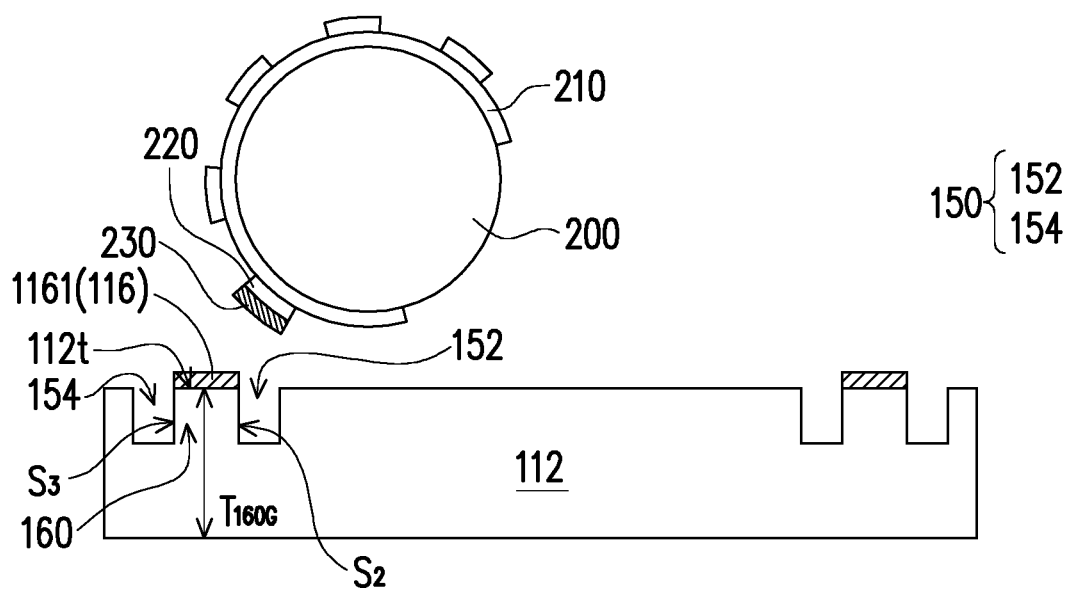

According to some embodiments, as shown in FIG. 3C, the light shielding layer 116 is printed by flexographic printing using a rolling cylinder 200. The rolling cylinder 200 may press over the support plate 112 and a printing substrate 210 may have a raised printing pattern 220 formed thereon. In some embodiments, the printing substrate 210 is rolled over the rolling cylinder 200 and an ink 230 is transferred on the raised printing pattern 220 in advance. When the rolling cylinder 200 brings the raised printing pattern 220 in contact with the support plate 112, the ink 230 on the raised printing pattern 220 is transferred to the top surface 112t of the support plate 112, thus forming portions 116I of the light shielding layer 116. In some embodiments, the raised printing pattern 220 of the printing substrate 210 may be so designed to contact the support plate 112 only where the protruding portion 160 is located, thus forming the light shielding layer 116 on the protruding portion 160. In some embodiments, at the contact with the support plate 112 a periphery of the raised printing pattern 220 may be positioned over the inner recess 152 or the outer recess 154 of the recess structure 150 surrounding the protruding portion 160. Because of the presence of the recess structure 150, the ink 230 on the periphery of the raised printing pattern 220 may not be printed onto the support plate 112, and the light shielding layer 116 formed by the ink 230 transferred from the raised printing pattern 220 may be confined on the protruding portion 160 without exceeding the area of the protruding portion 160. By doing so, linearity and sharpness of the edge of the light shielding layer 116 are determined by the linearity and sharpness of the walls $S_2$ and $S_3$ of the recess structure 150, e.g. the edges of the protruding portion 160. According to some embodiments of the present disclosure, by including the recess structure 150 in the support plate 112 it is possible to print with flexographic printing a light shielding layer 116 having sharp edges and good linearity.

Figure 3D:
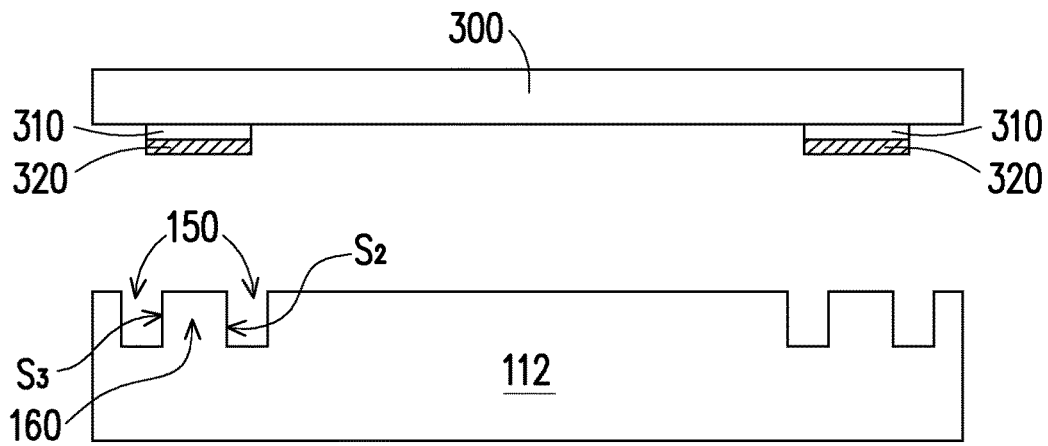

In FIG. 3D is illustrated the formation of the light shielding layer 116 (shown in FIG. 3B) according to an alternative embodiment of the present disclosure. In the embodiment illustrated in FIG. 3D, the light shielding layer 116 shown in FIG. 3B is produced by microcontact printing using a printing substrate 300. In detail, the printing substrate 300 having a raised printing pattern 310 may be soaked with ink 320, and pressed on the support plate 112. In some embodiments, the printing substrate 300 may contact the support plate 112 only through the raised printing pattern 310. Furthermore, the contact may happen only between the raised printing pattern 310 and the protruding portion 160 of the support plate 112, so that the ink 320 may be transferred only on the protruding portion 160 to form the light shielding layer 116 shown in FIG. 3B. Similar to what described above with reference to FIG. 3C, when the printing support 300 contacts the support plate 112, a periphery of the raised printing pattern 310 positioned overlapping with the inner recess 152 and/or the outer recess 154 may not transfer the ink 320 onto the support plate 112, so that linearity and sharpness of the edges of the light shielding layer 116 (as shown in FIG. 3B) are determined by the linearity and sharpness of the walls $S_2$ and $S_3$ of the recess structure 150. According to some embodiments of the present disclosure, by including the recess structure 150 in the support plate 112 it is possible to print with microcontact printing a light shielding layer 116 (as shown in FIG. 3B) having sharp edges and good linearity.

Figure 3E:
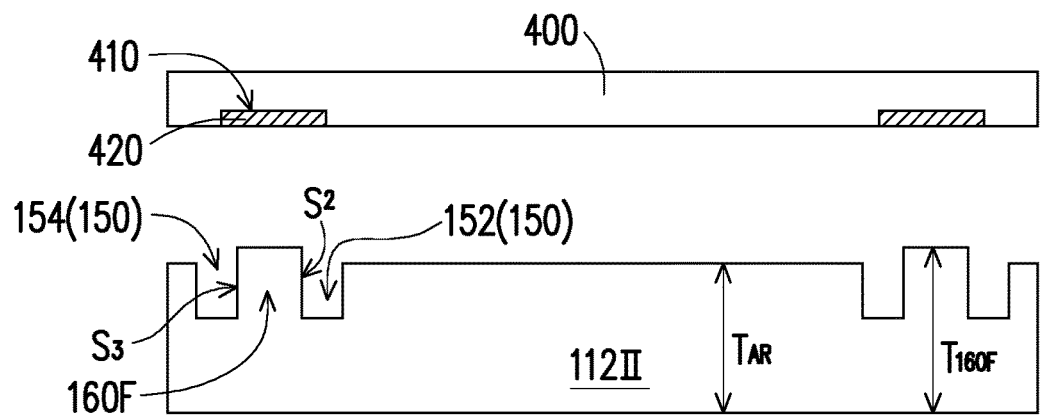
Figure 3F:
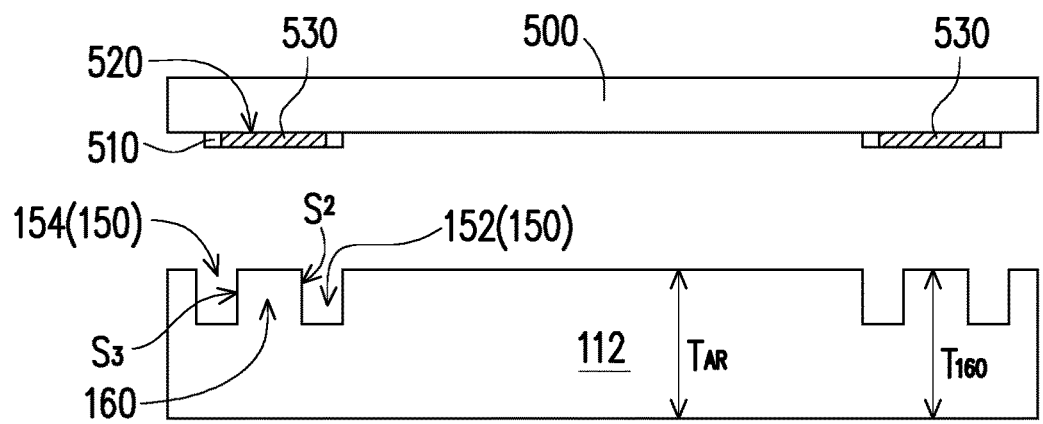

In FIGS. 3E and 3F are illustrated the formation of the light shielding layer 116 (as shown in FIG. 3B) according to alternative embodiments of the present disclosure. In the embodiments illustrated in FIG. 3E and in FIG. 3F, the light shielding layer 116 shown in FIG. 3B is produced by gravure printing. Referring to FIG. 3E, a printing substrate 400 having engraved therein an engraved printing pattern 410 may be provided. The engraved printing pattern 410 may be preliminary filled with ink 420 before pressing together the printing substrate 400 with the support plate 112. In some embodiments, to have the printing substrate 400 contact the support plate 112 through the engraved printing pattern 410 only in correspondence with the protruding portion 160F, the support plate 112II shown in FIG. 1F may be applied. Specifically, in the support plate 112II, the thickness $T_{160F}$ of the support plate 112II where the protruding portion 160F is may be greater than the thickness $T_{AR}$ of the support plate 112II in the central region. Therefore, when the printing substrate 400 and the support plate 112II are pressed together, the protruding portion 160F may enter into the engraved printing pattern 410. Similar to what described above with reference to FIG. 3C and FIG. 3D, when the printing support 400 contacts the support plate 112II in the described manner, a periphery of the engraved printing pattern 410 may be positioned overlapping with the recess structure 150, so that linearity and sharpness of the edges of the light shielding layer 116 (shown in FIG. 3B) are determined by the linearity and sharpness of the walls $S_2$ and $S_3$ of the recess structure 150.

According to some alternative embodiments, as shown in FIG. 3F, a printing substrate 500 may include a bulging portion 510 where an engraved printing pattern 520 is excavated. The bulging portion 510 may protrude from the printing substrate 500 towards the support plate 112 and the engraved printing pattern 520 may be filled with an ink 530 when the printing substrate 500 is disposed over the support plate 112. In some embodiments, when the printing substrate 500 and the support plate 112 are pressed together, the protruding portion 160 may enter into the engraved printing pattern 520 so that the ink 530 is transferred onto the protruding portion 160. In some embodiments, the ink 530 on the printing substrate 500 may contact the support plate 112 through the engraved printing pattern 520 only in correspondence with the protruding portion 160. By choosing an appropriate thickness for the bulging portion 510, the printing substrate 500 may selectively contact the protruding portion 160 of the support substrate 112 with the engraved printing pattern 520, independently of the relative magnitude of the thicknesses $T_{160}$ and $T_{AR}$ of the support plate 112. Similar to what described above with reference to FIG. 3C, FIG. 3D and FIG. 3E, when the printing support 500 contacts the support plate 112 in the described manner, a periphery of the engraved printing pattern 520 may be positioned overlapping with the recess structure 150, so that a linearity and a sharpness of the edges of the light shielding layer 116 are determined by the linearity and sharpness of the walls $S_2$ and $S_3$ of the recess structure 150. Based on the above, according to some embodiments of the present disclosure, by including the recess structure 150 in the support plate 112 it is possible to print with gravure printing a light shielding layer 116 (as shown in FIG. 3B) having sharp edges and good linearity.

For fabricating the display panel according to some embodiments of the disclosure, formations of the light shielding layer 116, the anti-reflective layer 118A (or 118B or 118C or 118D) and the electrode layer 114 as shown in FIG. 1A through FIG. 1G may be further performed to complete the top substrate, the top substrate may be assembled with a bottom substrate (shown in FIG. 1A) and a display medium layer (shown in FIG. 1A). The display medium layer (shown in FIG. 1A) may be sandwiched between the top substrate and the bottom substrate. In some embodiments, a material of the electrode layer 114 includes ITO or any other material that is conductive and transparent to the display light. A material of the anti-reflective layer 118A (or 118B or 118C or 118D) may include silicon oxide, titanium oxide, or a combination of both. In some embodiments, the electrode layer 114 and the anti-reflective layer 118A (or 118B or 118C or 118D) may be formed through deposition steps, such as thermal evaporation, sputtering, chemical vapor deposition, or plasma enhanced chemical vapor deposition, but the disclosure is not limited thereto, and other suitable deposition techniques may be adopted.

It should be noted that the disclosure is not limited by the order in which the electrode layer 114, the light shielding layer 116, the anti-reflective layer 118A (or 118B or 118C or 118D), and the recess structure 150 are formed on the top substrate 112, provided that the portion of the recess structure 150 disposed between the light shielding layer 116 and the active region AR is formed before forming the light shielding layer 116. For example, in some alternative embodiments, the anti-reflective layer 118A may be formed on the support plate 112 before the etching step is performed to form the recess structure 150, resulting in the absence of the anti-reflective layer in the bottom of the recess and the light shielding layer covering the anti-reflective layer above the protruding portion. In some yet alternative embodiments, portions 1182 or 1183 (shown in FIG. 1A) of the anti-reflective layer 118A may be selectively removed, for example to form the top substrates 110D of FIG. 1D or 110E of FIG. 1E from the top substrate 110A of FIG. 1A.

Figure 4A:
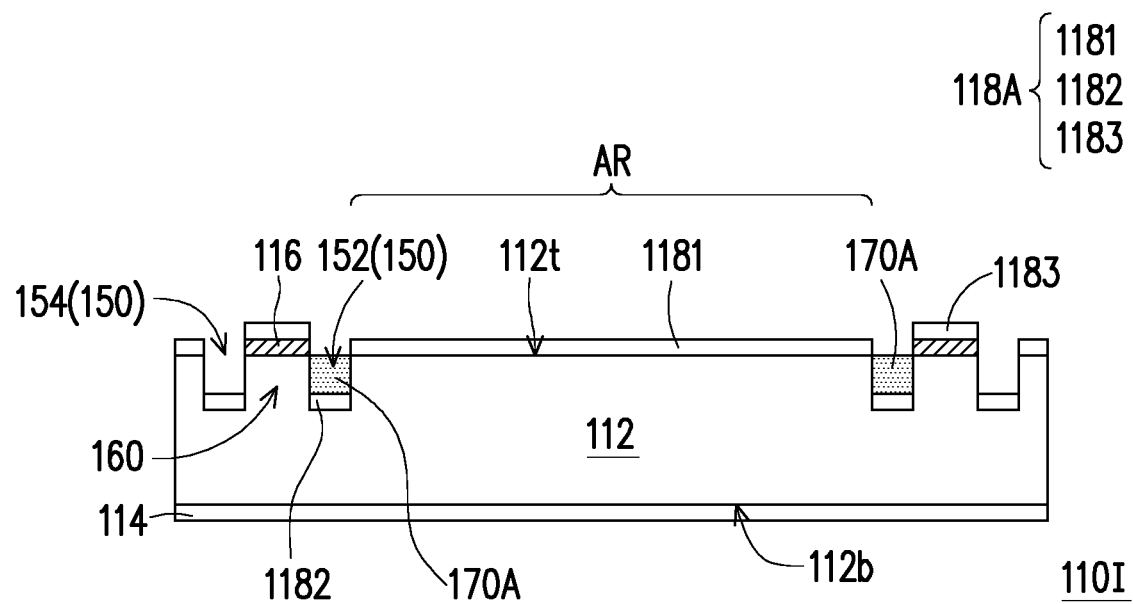
FIG. 4A to FIG. 4B show schematic cross-sectional views of top substrates of display panels according to some embodiments of the present disclosure.

FIG. 4A shows a cross-sectional view of a top substrate 110I of a display panel according to some embodiments of the present disclosure. The top substrate 110I of FIG. 4A is similar to the top substrate 110A of FIG. 1A, and the same or similar reference numbers are used to indicate the same or similar parts. Briefly, the top substrate 110I includes the support plate 112, the electrode layer 114 disposed on the bottom surface 112b of the support plate 112, the light shielding layer 116 disposed on the top surface 112t of the support plate 112 and the anti-reflective layer 1181 and 1182 disposed on the top surface 112t of the support plate 112. The recess structure 150 formed at the top surface 112t may include the inner recess 152 disposed between the light shielding layer 116 and the active region AR of the top substrate 110I, and the outer recess 154 encircling the light shielding layer 116. The protruding portion 160 of the support plate 112 may be entrenched in the recess structure 150. The anti-reflective layer 118A may include the first portion 1181 disposed on the top surface 112t in the active region AR of the support plate 112, the second portion 1182 disposed at the bottom of the recess structure 150, and the third portion 1183 that stacks with the light shielding layer 116. A difference between the top substrate 110A of FIG. 1A and the top substrate 110I of FIG. 4A is that the inner recess 152 is filled with an inorganic filler 170A.

Figure 4B:
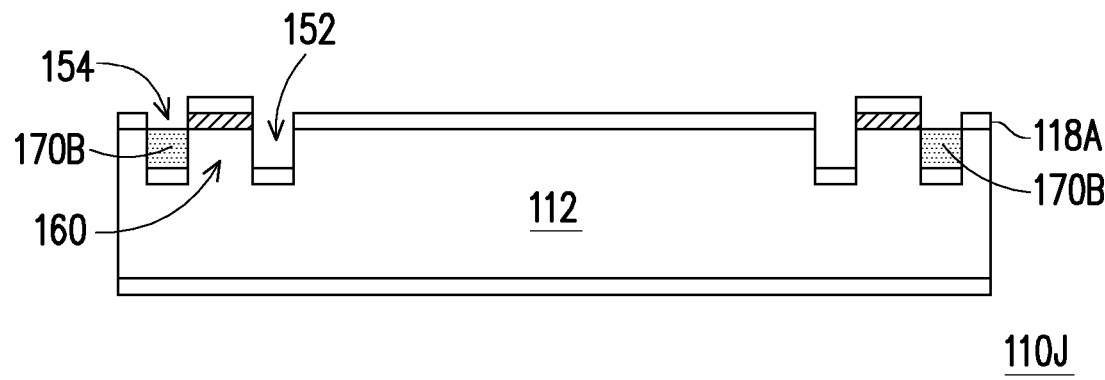

In some embodiments, the inorganic filler 170A may be disposed on the second portion 1182 of the anti-reflective layer 118A in the inner recess 152, but the disclosure is not limited thereto. In some alternative embodiments, the second portion 1182 of the anti-reflective layer 118A may be disposed on top of the inorganic filler 170A in the inner recess 152, and the inorganic filler 170A may be disposed at the bottom of the inner recess 152. In some alternative embodiments, as shown in FIG. 4B, in a top substrate 110J, an inorganic filler 170B is disposed in the outer recess 154 of the support plate 112. In some alternative embodiments (not shown), both the inner recess 152 and the outer recess 154 may be filled by the inorganic fillers 170A and 170B. In addition, the anti-reflective layer 118A may be absent from one or both of the inner recess 152 and the outer recess 154.

The inorganic filler 170A or 170B may act as an insulation material, and may provide protection to the protruding portion 160 of the top substrate 110I or 110J. In some embodiments, a material of the inorganic filler 170A or 170B includes silicon oxide, titanium oxide, aluminium oxide, zinc oxide, other inorganic oxides, or a combination thereof. In some embodiments, the material of the inorganic filler 170A or 170B is different than the material of the support plate 112, but the disclosure is not limited thereto. In some embodiments, the material of the inorganic filler 170A or 170B may be the same as the material of the support plate 112. In some embodiments, the material of the inorganic filler 170A or 170B is different than the material of the anti-reflective layer 118A, but the disclosure is not limited thereto. In some embodiments, the material of the inorganic filler 170A or 170B is the same as the material of the anti-reflective layer 118A. In some embodiments, the inorganic filler 170A or 170B may be formed by thermal evaporation, sputtering, chemical vapor deposition, or the like, but the disclosure is not limited thereto, and other suitable techniques may also be used.

Figure 5A:
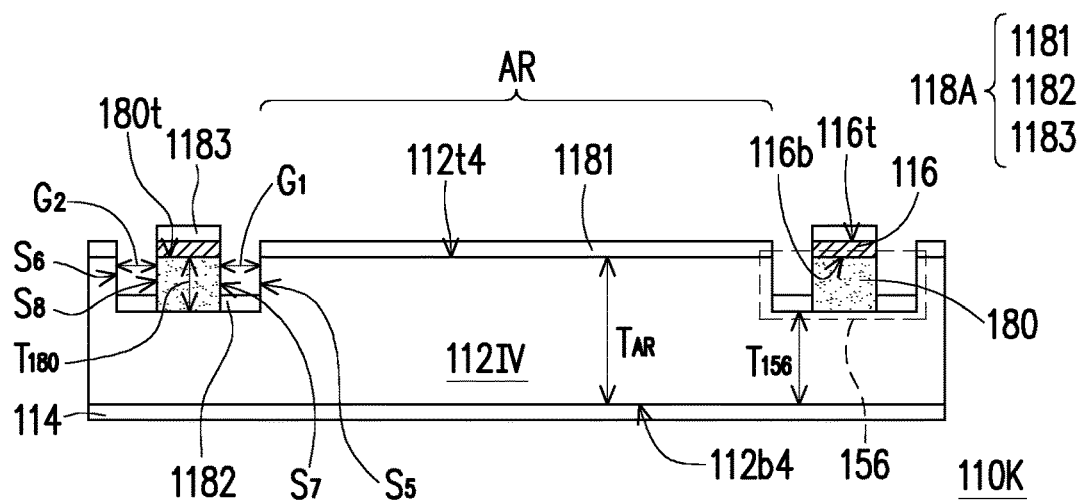
FIG. 5A to FIG. 5C show schematic cross-sectional views of top substrates of display panels according to some embodiments of the present disclosure.

FIG. 5A shows a cross-sectional view of a top substrate 110K of a display panel according to some embodiments of the present disclosure. The top substrate 110K shown in FIG. 5A may be an implementing example of some embodiments of the present disclosure. The top substrate 110K of FIG. 5A is similar to the top substrate 110A of FIG. 1A, and the same or similar reference numbers are used to indicate the same or similar parts. Briefly, the top substrate 110K includes the support plate 112IV having the electrode layer 114 disposed on the bottom surface 112b4 of the top substrate 112IV and the light shielding layer 116 and the anti-reflective layer 1181 and 1182 formed on the top surface 112t4 of the top substrate 112IV. A difference between the top substrate 110A of FIG. 1A and the top substrate 110K of FIG. 5A is that the top substrate 112IV has a recess structure 156 on the top surface 112t4, an inorganic support 180 is formed entrenched in the recess structure 156, and the light shielding layer 116 stacks on top of the inorganic support 180. That is, the inorganic support 180 is interposed between the light shielding layer 116 and the support plate 112IV in the recess structure 156. The anti-reflective layer 118A may include the first portion 1181 disposed on the top surface 112t4 in the active region AR of the top substrate 110K, the second portion 1182 disposed at the bottom of the recess structure 156, and the third portion 1183 that stacks with the light shielding layer 116 on the inorganic support 180.

As shown in FIG. 5A, the recess structure 156 is wider than the inorganic support 180 and has an inner wall $S_5$ encircling the active area AR of the top substrate 110K and an outer wall $S_6$ encircling the inorganic support 180. In some embodiments, the inner wall $S_5$ defines a boundary of the active region AR of the top substrate 110K. In some embodiments, a first gap $G_1$ extends between the inner wall $S_5$ of the recess structure 156 and the inorganic support 180 and a second gap $G_2$ extends between the outer wall $S_6$ and the inorganic support 180, but the disclosure is not limited thereto. In other words, the inorganic support 180 is positioned in the central region of the recess structure 156 without contacting either the inner wall $S_5$ or the outer wall $S_6$ of the recess structure 156. As shown for an alternative top substrate 110L in FIG. 5B, in some alternative embodiments, the second gap $G_2$ may be omitted, and the recess 156' of the support plate 112V may have a width so that the outer wall $S_{6'}$ may directly contact the inorganic support 180 and the inner wall $S_{5'}$ is spaced from the inorganic support 180 by the first gap $G_1$.

Referring back to FIG. 5A, in some embodiments, a thickness $T_{180}$ of the inorganic support 180 may be adjusted as a function of the thickness $T_{AR}$ of the support plate 112IV in the active region AR and the thickness $T_{156}$ of the support plate 112IV where the recess structure 156 is formed. In the situation illustrated in FIG. 5A, the thickness $T_{180}$ of the inorganic support 180 is equal to a difference between the thickness $T_{AR}$ of the support plate 112IV in the active region AR and the thickness $T_{156}$ of the support plate 112IV where the recess structure 156 is formed. In other words, a top surface 180t of the inorganic support 180 may be coplanar with the top surface 112t4 of the support plate 112IV in the active region AR. However, the disclosure is not limited thereto. In some alternative embodiments (not shown), the thickness $T_{180}$ of the inorganic support 180 may be greater than the difference between the thickness $T_{AR}$ of the support plate 112IV in the active region AR and the thickness $T_{156}$ of the support plate 112IV where the recess structure 156 is formed, so that the bottom surface 116b of the light shielding layer 116 is further from the bottom surface 112b4 of the support plate 112IV than the top surface 112t4 of the support plate 112IV in the active region AR. In some alternative embodiments (not shown), the thickness $T_{180}$ of the inorganic support 180 may be smaller than the difference between the thickness $T_{AR}$ of the support plate 112IV in the active region AR and the thickness $T_{156}$ of the support plate 112IV where the recess structure 156 is formed. In same alternative embodiments, by adjusting the thickness $T_{180}$ of the inorganic support 180, the top surface 116t of the light shielding layer 116 may be coplanar with or lower than the top surface 112t4 of the support plate 112IV in the active region AR.

In some embodiments, a material of the inorganic support 180 includes silicon oxide, titanium oxide, aluminium oxide, zinc oxide, other inorganic oxides, or a combination thereof. In some embodiments, the material of the inorganic support 180 is different than the material of the support plate 112IV, but the disclosure is not limited thereto. In some embodiments, the inorganic support 180 is formed by a plurality of stacked support layers. For example, as shown in FIG. 5C for the top substrate 110M, the inorganic support 180M may include a first support layer 1801 disposed at the bottom of the recess structure 156, a second support layer 1802 disposed on the first support layer 1801, and a third support layer 1803 disposed on the second support layer 1802. The first support layer 1801 is disposed between the second support layer 1802 and the support plate 112IV. The second support layer 1802 is disposed between the first support layer 1801 and the third support layer 1803. The third support layer 1803 is disposed between the second support layer 102 and the light shielding layer 116 or the anti-reflective layer 118A (according to some alternative embodiments, not shown). In some embodiments, adjacent support layers may include different materials, but the disclosure is not limited thereto.

Figure 5B:
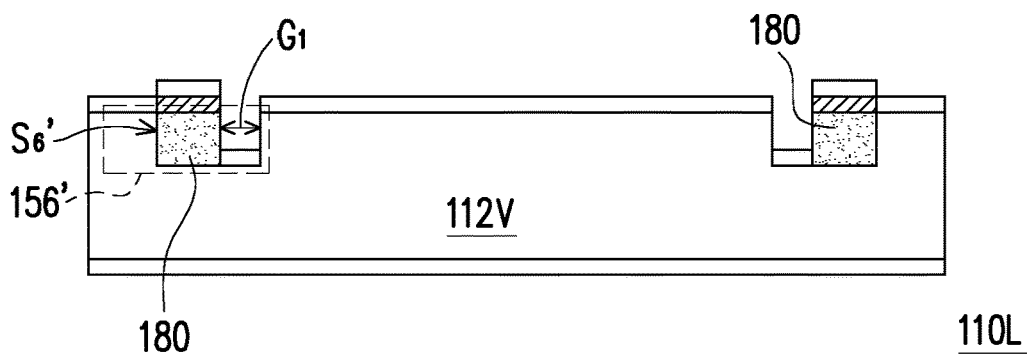
Figure 5C:
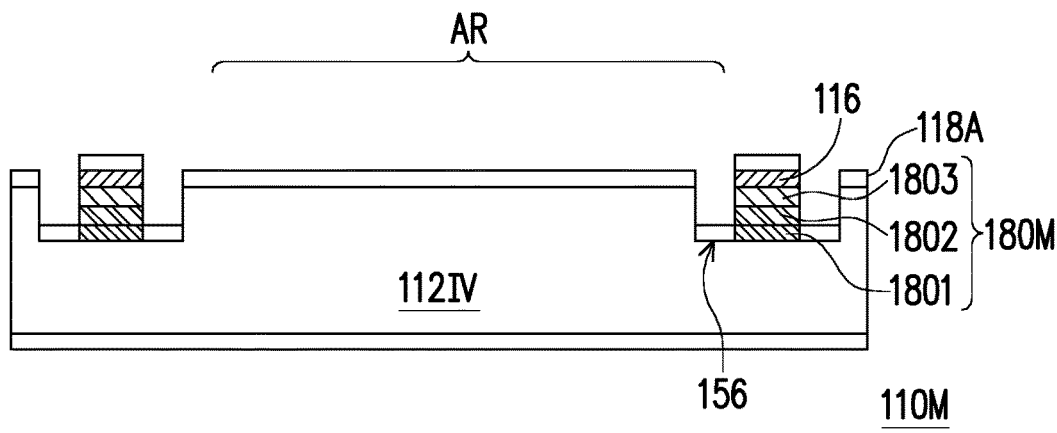

The fabricating processes of the top substrates shown in FIG. 5A to FIG. 5C include the step of forming the inorganic support 180 within the recess structure 156. In some embodiments, the inorganic support 180 is formed by thermal evaporation or sputtering, but the disclosure is not limited thereto, and any suitable technique may be used. In some embodiments where the inorganic support 180M has a multi-layered structure, multiple deposition steps may be performed.

In some embodiments, walls $S_7$ and $S_8$ (shown in FIG. 5A) of the inorganic support 180 have a sharp vertical profile. In some embodiments, the walls $S_7$ and $S_8$ of the inorganic support 180 face the inner wall $S_5$ and the outer wall $S_6$ of the recess structure 156, respectively. In some embodiments, the light shielding layer 116 is formed in a similar manner as previously described with reference to FIG. 3C to FIG. 3F, but the disclosure is not limited thereto. In the present embodiment, the inorganic support 180 (or 180M) may perform a similar function as the protruding portion 160 (shown, for example, in FIG. 3B through FIG. 3F). That is, the inorganic support 180 (or 180M) may act as contact point between the support plate 112IV and a printing substrate (which may be analogous to the printing substrates 210, 300, 400, or 500 previously described). In other words, sharpness and linearity of the edges of the light shielding layer 116 may be determined by the sharpness and linearity of the walls $S_7$ and $S_8$ of the inorganic support 180 (or 180M). As such, forming the light shielding layer 116 on the inorganic support 180 (or 180M) by printing techniques such as flexographic printing, microcontact printing or gravure printing yields a light shielding layer 116 with edges showing good linearity and sharp pattern.

Figure 6A:
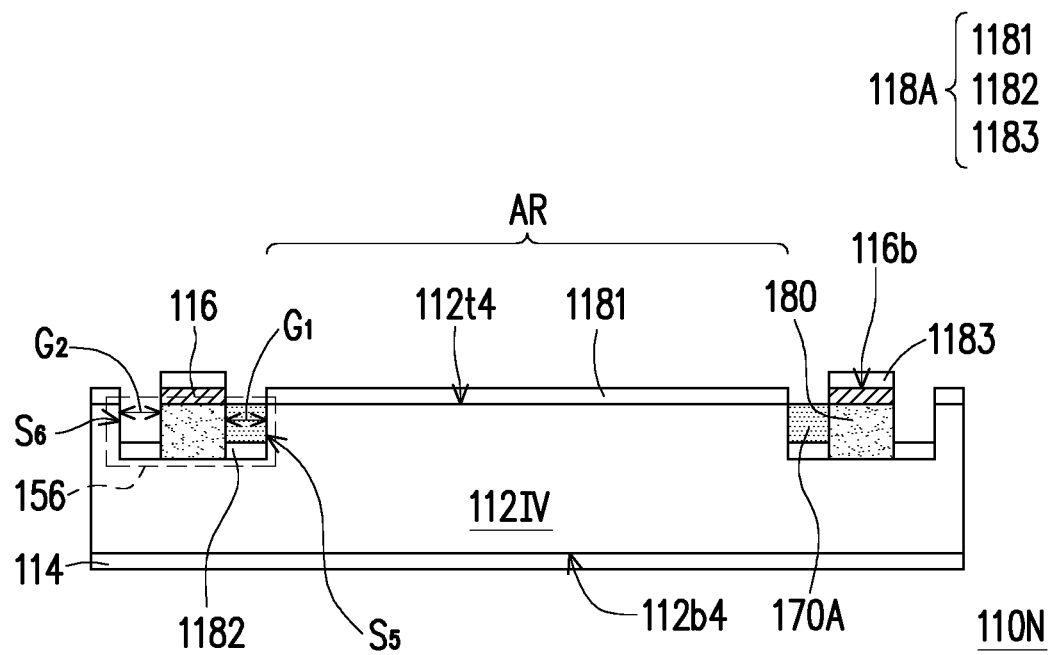
FIG. 6A to FIG. 6B show schematic cross-sectional views of top substrates of display panels according to some embodiments of the present disclosure.
Figure 6B:
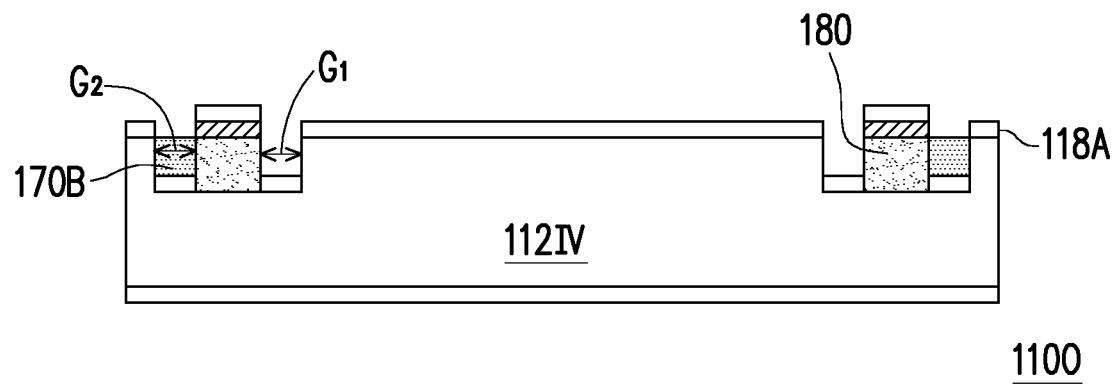

FIG. 6A shows a cross-sectional view of a top substrate 110N of a display panel according to some embodiments of the present disclosure. The top substrate 110N shown in FIG. 6A may be an implementing example of some embodiments of the present disclosure. The top substrate 110N of FIG. 6A is similar to the top substrate 110K of FIG. 5A, and the same or similar reference numbers are used to indicate the same or similar parts. Briefly, the top substrate 110N includes the support plate 112IV having the electrode layer 114 disposed on the bottom surface 112b4 thereof and the light shielding layer 116, the anti-reflective layer 1181 and 1182 and the recess structure 156 formed on the top surface 112t4 thereof. The inorganic support 180 may be disposed within the recess structure 156. The inner wall $S_5$ of the recess structure 156 may encircle the active region AR of the top substrate 110N, whilst the outer wall $S_6$ may encircle the inorganic support 180. A first gap $G_1$ may extend between the inorganic support 180 and the inner wall $S_5$, and a second gap $G_2$ may extend between the outer wall $S_6$ and the inorganic support 180. The anti-reflective layer 118A may include the first portion 1181 disposed on the top surface 112t4 in the active region AR of the top substrate 110N, the second portion 1182 disposed at the bottom of the recess structure 156, and the third portion 1183 that stacks with the light shielding layer 116 on top of the inorganic support 180. A difference between the top substrate 110K of FIG. 5A and the top substrate 110N of FIG. 6A is that the first gap $G_1$ is filled with the inorganic filler 170A. In some embodiments, the inorganic filler 170A may be disposed on the part of the second portion 1182 of the anti-reflective layer 118A disposed in the first gap $G_1$, but the disclosure is not limited thereto. As shown in FIG. 6B, in a top substrate 110O according to some alternative embodiments, the inorganic filler 170A is not disposed within the first gap $G_1$, but the inorganic filler 170B is disposed in the second gap $G_2$. In some alternative embodiments (not shown), both the first gap $G_1$ and the second gap $G_2$ may be filled by the inorganic fillers 170A and 170B, respectively.

In light of the foregoing, the display panel according to an embodiment of the disclosure includes a top substrate having a support plate, a recess structure, and a light shielding layer. The light shielding layer is disposed on a top surface of the support plate. The recess structure is formed at the top surface of the support plate, and encircles an active region of the top substrate. A bottom of the light shielding layer is further from a bottom surface of the support plate than a bottom of the recess structure. The recess structure is at least partially located between the active region and the light shielding layer. When manufacturing the display panel, forming the portion of the recess structure interposed between the light shielding layer and the active region before the light shielding layer, allows the light shielding layer with sharp and linear edges through printing techniques such as flexographic printing, microcontact printing, or gravure printing. In some embodiments, the light shielding layer is formed on a structure entrenched in the recess structure, where the structure may be a protrusion of the support plate defined by the walls of the recess structure or some other inorganic support disposed within the recess structure. In some embodiments, sharpness and linearity of the edges of the light shielding layer are determined by the sharpness and linearity of the walls of the recess structures or the walls of the inorganic support. In a manufacturing method according to some embodiments of the disclosure, it is possible to adopt relatively cheap and fast printing techniques to form light shielding layer with sharp and linear edges, thus reducing a failure rate of the process, increasing the product yields and lowering the manufacturing costs.

It will be apparent to those skilled in the art that various modifications and variations can be made to the structure of the present disclosure without departing from the scope or spirit of the disclosure. In view of the foregoing, it is intended that the present disclosure covers modifications and variations of this disclosure, provided these falls within the scope of the following claims and their equivalents.

What is claimed is:
1. A display panel, comprising:
a top substrate, a bottom substrate, a display medium layer disposed between the top substrate and the bottom substrate, wherein the top substrate comprises:
a support plate, having a bottom surface facing the display medium layer and a top surface, wherein the support plate comprises a recess structure formed at the top surface and encircling an active region of the top substrate, the recess structure comprises an inner recess and an outer recess;
a protruding portion, located between the inner recess and the outer recess, and the inner recess being between the protruding portion and the active region, and
a light shielding layer, disposed on the disposed on the protruding portion, wherein the recess structure is at least partially located between the active region and the light shielding layer, and a bottom surface of the light shielding layer is further from the bottom surface of the support plate than a bottom surface of the recess structure.

2. The display panel of claim 1, wherein the protruding portion is entrenched in the recess structure, and the protruding portion is of the same material of the support plate.

3. The display panel of claim 2, wherein a thickness of the support plate at a region where the protruding portion is and a thickness of the support plate at the active region are both greater than a thickness of the support plate at a region where the recess structure is.

4. The display panel of claim 3, wherein the thickness of the support plate at the region where the protruding portion is and the thickness of the support plate at the active region are not identical.

5. The display panel of claim 1, wherein an inorganic filler is disposed in one or both of the inner recess and the outer recess.

6. The display panel of claim 1, wherein the protrusion portion is formed by an inorganic support formed in the recess structure of the top substrate to separate the recess structure into the inner recess and the outer recess, and the inorganic support is interposed between the light-shielding layer and the support plate.

7. The display panel of claim 6, wherein the recess structure has an inner wall encircling the active region and an outer wall encircling the inorganic support, a first gap exists between the inorganic support and the inner wall of the recess structure, and a second gap exists between the inorganic support and the outer wall of the recess structure.

8. The display panel of claim 7, further comprising an inorganic filler filling the recess at one or both of the first gap and the second gap.

9. The display panel of claim 6, wherein the inorganic support comprises a plurality of stacked support layers.

10. The display panel of claim 1, further comprising an anti-reflective layer disposed on the top surface in the active region of the top substrate.

11. The display panel of claim 10, wherein the anti-reflective layer further covers the top surface at the bottom of the recess structure.

12. The display panel of claim 10, wherein the anti-reflective layer further stacks with the light shielding layer.

13. The display panel of claim 12, wherein a portion of the anti-reflective layer is disposed between the light-shielding layer and the support plate.

14. The display panel of claim 13, wherein a top surface or a bottom surface of the portion of the anti-reflective layer is coplanar with the top surface of the support plate in the active region.

15. The display panel of claim 12, wherein the light shielding layer is disposed between a portion of the anti-reflective layer and the support plate.

16. The display panel of claim 15, wherein a top surface or a bottom surface of the light-shielding layer is coplanar with the top surface of the support plate in the active region.

17. A method of fabricating a display panel, the method comprising:
providing a top substrate, wherein providing a top substrate comprises:
forming a recess structure in a top surface of a support plate, the recess structure encircling an active region of the top substrate, wherein the forming the recess structure comprises forming an inner recess surrounding the active region and an outer recess surrounding the inner recess by removing respective portions of the support plate, a protruding portion of the support plate between the inner recess and the outer recess is remained, and the light-shielding layer is printed on the protruding portion; and
printing a light-shielding layer over the top surface of the support plate at a level further from a bottom surface of the support plate than a bottom surface of the recess structure, wherein the recess structure is at least partially located between the active region and the light shielding layer; and
assembling the top substrate with a bottom substrate and a display medium layer, wherein the display medium layer is sandwiched between the top substrate and the bottom substrate.

18. The method of claim 17, wherein the light-shielding layer is printed by flexographic printing, or gravure printing.

19. The method of claim 17, further comprising filling the recess structure or a portion of the recess structure with an inorganic filler on a side of the light shielding layer.

20. A method of fabricating a display panel, the method comprising:
providing a top substrate, wherein providing a top substrate comprises:
forming a recess structure in a top surface of a support plate, the recess structure encircling an active region of the top substrate;
printing a light-shielding layer over the top surface of the support plate at a level further from a bottom surface of the support plate than a bottom surface of the recess structure, wherein the recess structure is at least partially located between the active region and the light shielding layer;
forming an inorganic support in a central region of the recess structure, wherein the light-shielding layer is printed over the inorganic support; and
assembling the top substrate with a bottom substrate and a display medium layer, wherein the display medium layer is sandwiched between the top substrate and the bottom substrate.

* * * * *